United States Patent [19]

Kosugi et al.

[11] 4,179,110

[45] Dec. 18, 1979

[54] METHOD FOR OPPOSING A SHEET-LIKE MATERIAL TO A STANDARD PLANE WITH PREDETERMINED SPACE THEREBETWEEN

[75] Inventors: Masao Kosugi; Hideki Yoshinari, both of Kawasaki, Japan

[73] Assignee: Canon Kabushiki Kaisha, Tokyo, Japan

[21] Appl. No.: 769,900

[22] Filed: Feb. 18, 1977

Related U.S. Application Data

[63] Continuation of Ser. No. 679,825, Apr. 23, 1976, abandoned, which is a continuation of Ser. No. 580,704, May 27, 1975, abandoned.

[30] Foreign Application Priority Data

May 28, 1974 [JP] Japan .................................. 49-59922
May 28, 1974 [JP] Japan .................................. 49-59923

[51] Int. Cl.$^2$ ............................................ B65H 39/00
[52] U.S. Cl. ..................................... 270/58; 206/328; 355/78
[58] Field of Search .................... 270/52, 58; 355/78, 355/91; 356/171-172; 29/578, 592; 302/2 R; 214/1 Q, 1 BE; 269/57; 206/328, 332

[56] References Cited

U.S. PATENT DOCUMENTS

| | | | |
|---|---|---|---|
| 3,490,846 | 1/1970 | Kasper | 355/78 |
| 3,521,955 | 7/1970 | Tancredi | 355/78 |
| 3,685,117 | 8/1972 | Wing | 355/78 |
| 3,870,416 | 3/1975 | Brady | 356/172 |

Primary Examiner—Edgar S. Burr
Assistant Examiner—A. Heinz
Attorney, Agent, or Firm—Toren, McGeady and Stanger

[57] ABSTRACT

A method for opposing a sheet-like material to a standard plane with predetermined space therebetween, which method when applied to a non-contact (proximity) printer such as one of IC and LSI construction, can improve the efficiency of the printing operation. The method comprises two sub-steps of a preparation step and a step for actually opposing the sheet-like material to the standard plane; the preparation step is done where no standard plane is present and in the preparation step the space or distance between a sub-standard plane having a predetermined relation with the standard plane and the sheet-like material on a carrier is measured and the measured value is memorized. After the completion of the preparation step, the sheet-like material is transferred together with the carrier to the position at which the standard plane is present, and then the memorized value is reproduced and the position of the carrier is determined in respect to the standard plane on the basis of the reproduced value used as a factor, thereby the distance between the surface of the sheet-like material and the standard plane corresponds to the predetermined value.

2 Claims, 14 Drawing Figures

METHOD FOR OPPOSING A SHEET-LIKE MATERIAL TO A STANDARD PLANE WITH PREDETERMINED SPACE THEREBETWEEN

This is a continuation of application Ser. No. 679,825 filed Apr. 23, 1976, which, in turn was a continuation application of Ser. No. 580,704 filed May 27, 1975, both applications now being abandoned.

BACKGROUND OF THE INVENTION

1. Field of the Invention

The present invention relates to a method for efficiently opposing the surface of a sheet-like material to a standard plane with a predetermined space or distance therebetween.

2. Description of the Prior Art

The method for opposing the sheet-like material to the standard plane with a predetermined space therebetween has been used often in a device in which a pattern is recorded on a sensitive material such as an IC (integrated circuit) pattern printing machine. For example, in a non-contact (proximity) IC or LSI (large scale integrated) pattern printing machine, the pattern of a mask (standard plane) is printed on the surface of a sensitive material (sheet-like material) with a space of several tens of microns therebetween. However, in these machines, IC or LSI patterns of good quality can not be obtained unless the space between the surface of the sensitive material and the mask is at a particular predetermined space. For this purpose, it may be considered that the printing is done with the space between the carrier and the mask being fixed, but this method has a defect that the space between the surface of the sensitive material and the mask varies depending on the sensitive material even when the sensitive material is coated uniformly on a wafer, because a silicon wafer used for producing IC or LSI patterns has usually an error of 0.2 to 0.3 mm (in the case of a 2 inch diameter wafer) and 0.5 to 0.7 mm (in case of a 3 inch diameter wafer), and the wafer itself has an irregular thickness, and thus IC or LSI patterns of good quality can not be obtained.

For overcoming the above defects, a method has been proposed, in which an equalizer mechanism such as a spherical receiver is provided on the sensitive material carrier to make the carrier tiltable, and the sensitive material is deposited on the carrier and the carrier is moved toward a calibrator having a collision plane present at a predetermined space so as to collide the surface of the sensitive material with the collision plane.

According to the above method, the relation between the sensitive material and the mask surface is that they are parallel and spaced with a predetermined distance, and thus IC or LSI patterns of good quality can be obtained. However, in this conventional method, the sensitive material collides with the calibrator at the position of the mask so that many steps are required at the position of the mask, thus lowering the operation efficiency.

SUMMARY OF THE INVENTION

One of the objects of the present invention is to provide a method for opposing a sheet-like material to a standard plane with a predetermined space therebetween free from the above defects.

The above object of the present invention is attained by measuring the space between a sub-standard plane relating to the standard plane and the sheet-like material on the carrier at a position different from the position of the standard plane, memorizing the measured value, transferring the sheet-like material together with the carrier to the position of the standard plane and determining the positional relation between the standard plane and the carrier on the basis of the memorized value.

Explanations will be made more specifically in connection with an IC or LSI printing machine.

According to the conventional machine, the printing is done by the following steps in combination; a step of placing a wafer at the position of a mask, namely on a wafer carrier in case of an exposure station, a step of determining the position of the wafer, a step of moving the calibrator close to the mask surface, a step of collision of the wafer and the calibrator, a step of retreating the calibrator apart from the mask surface, a step of adjusting the positions of the wafer and the mask, a step of exposure and a step of removing the wafer after the exposure.

Whereas according to the present invention, it is not necessary to collide the calibrator and the wafer in the exposure station so that the collision step and its accompanying steps can be eliminated and thus the operation can be done efficiently. Further, a printing machine using the method of the present invention can have a structure which assures high efficiency of operation as under.

Thus when the printing machine is constructed with the wafer position determining station, the measurement and memory station and the exposure station, and the wafer and the carrier between the individual stations, the time required by one exposure operation can be shortened, and the steps at the individual stations in this machine are as described below.

|  | First Step | Second Step | Third Step | Fourth Step |
|---|---|---|---|---|
| Wafer Position Determining Station | Placement of Wafer | Determination of Wafer Position |  |  |
| Measurement Memory Station | Transfer from Wafer Position Determining Station | Collision with Calibrator |  |  |
| Exposure Station | Transfer from Measurement Memory Station and Removal of Exposed Wafer | Determination of Carrier | Alignment | Exposure |

With the above serial arrangement of the steps, the efficiency of the printing operation is greatly enhanced.

The present invention will be described in connection with the above printing machine referring to the attached drawings.

BRIEF EXPLANATION OF THE DRAWINGS

FIG. 1-A shows a front view of the main portion of the wafer printing machine adopted to the method of the present invention.

FIG. 1-B is a cross sectional view along the line X-X' in the printing machine shown in FIG. 1-A.

FIG. 3-A and FIG. 3-B show respectively the operation of the carrier shown in FIG. 2.

FIG. 7-A, FIG. 7-B and FIG. 7-C show respectively the principle of the operation of the carrier shown in FIG. 6.

PREFERRED EMBODIMENTS OF THE INVENTION

Figure 1A:
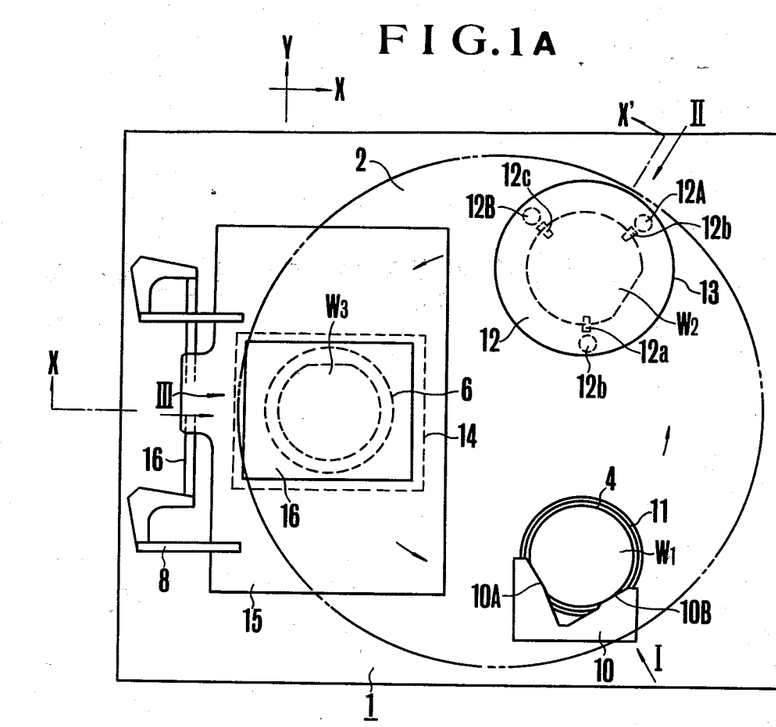
Figure 1B:
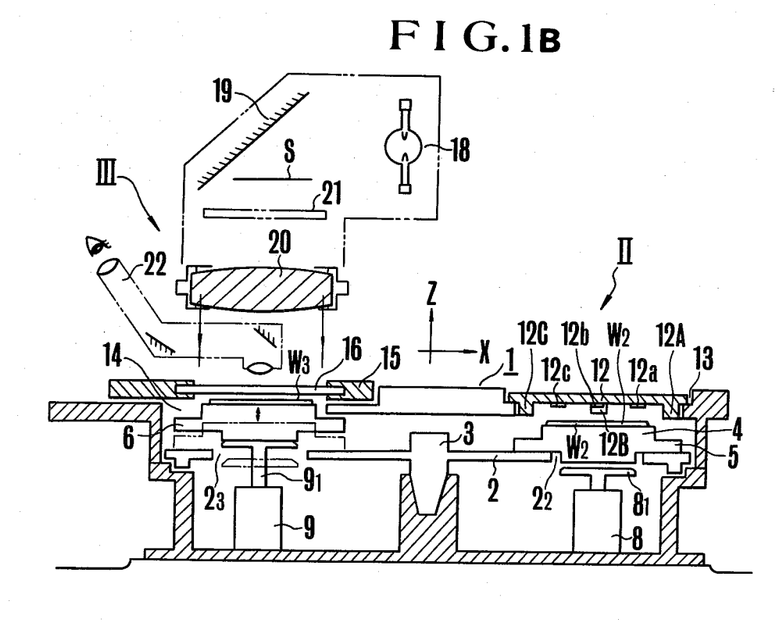

In FIG. 1-A, the upper surface of a casing 1 of the printing machine is shown and on this upper surface there are formed the wafer position determining station I, the measurement and memory station II and the exposure station III with 120 degrees spacing around the rotation shaft 3 of the turn table 2 shown in FIG. 1-B. The wafer position determining station supplies the wafer to the wafer carrier and determines the position of the wafer in respect to the carrier. The measurement and memory station makes the wafer of the carrier transferred from the station I collide with the collision surface of the calibrator and memorizes the inclination and/or distance etc. of the carrier to the collision surface. The exposure station III determines the position of the carrier transferred from the station II in respect the mask surface on the basis of the above measured value, then adjusts the positional relation between the mask and the wafer and effects the exposure. The transfer of the carrier between the individual stations is performed by means of the turn table 2. The turn table 2 is rotatable around the shaft 3 and is controlled by a rotation driving control mechanism (not shown) so as to rotate by 120 degrees. $2_1$, $2_2$ and $2_3$ are openings provided on the turn table 2, which come to the stations I, II and III, respectively when the turn table stops. 4, 5 and 6 are respectively a wafer carrier having a portion freely engageable in the openings $2_1$, $2_2$ and $2_3$, a flange portion and wafer placing surface. On the placing surfaces of the carriers 4, 5 and 6, there are placed wafers $W_1$, $W_2$ and $W_3$. 7, 8 and 9 are respectively a cylinder provided on the stations I, II and III. The cylinders 7, 8 and 9 have cylinder surfaces $7_1$, $8_1$ and $9_1$, which oppose to the lower surfaces of the carriers 4, 5 and 6. The cylinder surfaces $7_1$, $8_1$ and $9_1$ rise in the direction to push upwards the carriers 4, 5 and 6. When the turn table stops, and then the carriers get down prior to the subsequent 120 degree rotation of the turn table 3.

Explanations will be made on each of the stations.

The wafer position determining station I (FIG. 1-A)

In the figure 11 is an opening for supplying the wafer, provided on the upper surface of the casing 1, 10 is a member provided on the upper surface along the side lines of the supplying opening 11, which determines the position of the wafer, and 10A and 10B are respectively a wafer engagement surface. In the first step, the turn table 3 transfers the carrier carrying no wafer to the station I and then in the second step, the cylinder head $7_1$ rises after the turn table stops and pushes upwards the carrier towards the supplying opening 11. When the placing surface of the carrier gets out of the supplying opening, the cylinder head $7_1$ stops rising, when the wafer is placed on the placing surface. The wafer $W_1$ rotates by means of a rotating means (not shown) and this rotation is stopped when the edge portion of the wafer $W_1$ engages with the surfaces 10A and 10B. In this way, the position of the wafer is determined. For further informations of the position determining method, reference should made to the U.S. Pat. application Ser. No. 557,294 filed by the present applicants, now issued as U.S. Pat. No. 3,982,627.

After the determination of the position, the cylinder head $7_1$ moves down and the cylinder 7 does not operate until the completion of the subsequent rotation of the turn table 3.

The measurement and memory station II (FIG. 1-B)

As shown in FIG. 1-B, there is provided an opening 13 on the upper surface of the casing 1, and a calibrator 12 is fixed to the opening 13. 12a, 12b and 12c are respectively a pin planted on the lower surface of the calibrator, which forms a sub-standard plane. Regarding the relation between the sub-standard plane and the mask surface (standard plane) of the exposure station, it is desirable that the sub-standard plane is apart from the mask surface by a distance desired at the time of exposure between the mask surface and the wafer surface. However, as it is possible to determine the position of the carrier by calculating the relation between the mask surface and the sub-standard surface, the desired relation is not always necessary.

In the first step, the carrier 5 carrying the wafer $W_3$ transferred from the station I by the rotation of the turn table 3 is transferred to the station II. In the second step, the cylinder head is raised to push up the carrier 5, thereby the wafer $W_2$ contacts the pins 12a, 12b and 12c and the rising of the carrier 5 stops. The stop position and the inclination of the carrier in respect to the sub-standard plane is memorized by a memorizing means not shown. However, there are some cases in which the carrier 5 inclines due to the wafer and in such cases it is necessary to attach an equalize to the cylinder 8 or to provide a rubber attraction plate on the carrier 5 as described hereinafter.

The exposure station III

In the figure 14 is an opening provided on the upper surface of the casing 1, 15 is a mask holder to which the mask 16 is fixed and the mask holder 15 is slidable on the upper surface of the casing 1 in the directions X and Y. 16 is a member which drives the mask holder 15, 18 is an illumination light source, 19 is an inclined mirror and 20 is a condenser lens, and these members constitute the illumination optical system. 21 is a diffusion plane or a fly's eye lens, and 22 is a microscopic optical system for the mask alignment. It is desired that the optical system 22 is provided therein with an illumination light source which is non-sensitive to the wafer $W_3$.

The carrier 6 transferred from the station II in the first step is pushed upwards towards the mask 15 by the cylinder 9 and rises until it takes a predetermined space and inclination in respect to the mask 16 on the basis of the measured value memorized in the station II, and in this way the predetermined space is maintained between the wafer $W_3$ and the mask 16. The stop position of the carrier is maintained until the completion of the exposure.

In the third stop, the alignment optical system 22 moves to the position as shown and the mask holder 15 is made to slide under observation by the optical system 22 to effect alignment with the wafer $W_3$. In the fourth step, the shutter of the illumination optical system is opened to expose the wafer for a predetermined time, thereby the mask 16 is printed on the wafer $W_3$.

Next, explanations will be made on the equalizer mechanism and the measuring and memorizing mechanism in the second station II. All of these mechanisms are provided on the wafer carriers 4, 5 and 6 in the embodiments of the present invention, and therefore descriptions will be made in connection with the wafer carrier referring to FIG. 2.

Figure 2A:
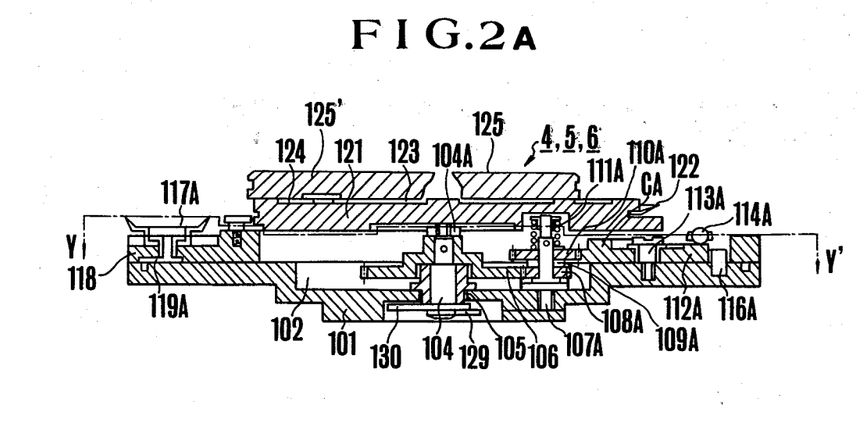
FIGS. 2A-D shows a wafer carrier used in the printing machine shown in FIG. 1 and FIG. 2-A is its cross sectional view, FIG. 2-B is a decomposed front view of the portion Y-Y', and FIG. 2-C is a cross sectional view of the carrier along the line Z-Z' in FIG. 2-B, and FIG. 2-D is a cross sectional view showing the arrangement of the wafer chuck stand and the wafer chuck.
Figure 2B:
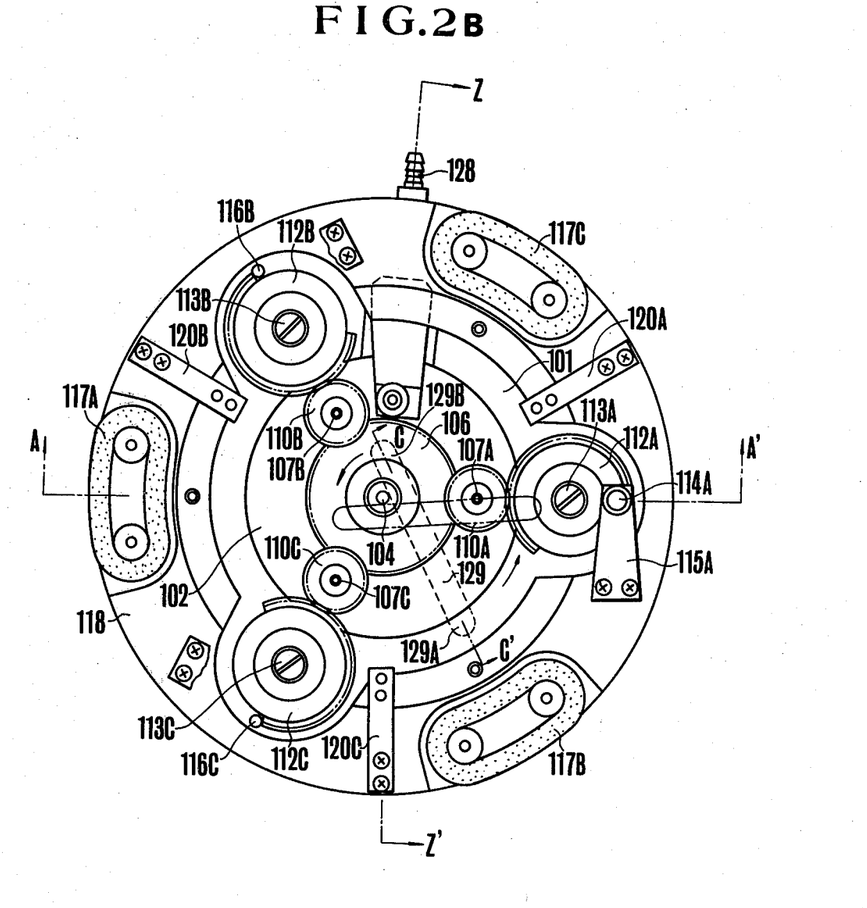
Figure 2C:
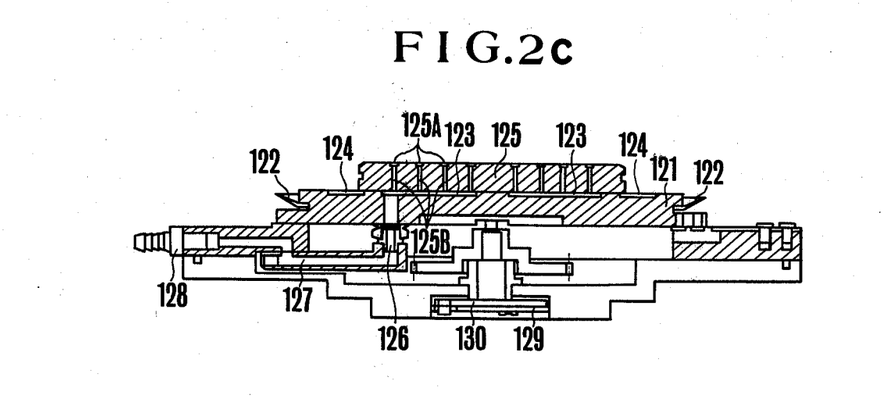
Figure 2D:
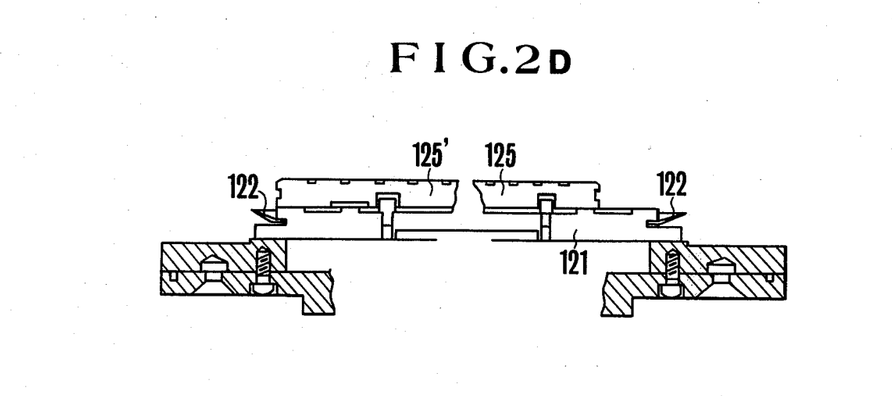

In the figure, 101 is a base plate having a recession of circular dish-like form, 104 is a driving shaft engaged rotatably in a sleeve 105 engagedly supported by a bearing hole provided in the center of the recession, 106 is a driving gear engaged in a small-diameter portion of the upper stepped portion of the driving shaft 104, and fixed by a stopper screw to the driving shaft 104, so as to rotate together with the shaft. 107A, 107B and 107C are driving bearings planted on the base plate 101 with an equal spacing of 120 degrees, and provided with gear 108A, 108B and 108C respectively engageable with the driving gear 106, further provided coaxially with second gears 110A, 110B and 110C respectively using a slip ring such as a washer therebetween. The driving bearings are pressed by coil springs 111A, 111B and 111C respectively, and constitute a slip driving mechanism. 112A, 112B and 112C are cam gears rotatably engaged with shafts 113A, 113B and 113C planted on the base plate 101, and forming slant cams CA, CB and CC on their top end surfaces. 114A, 114B and 114C (114B and 114C are not shown in FIG. 2-B) are small steel balls (hereinafter called ball member) engaged in small holes formed in free-end spring members 115A, 115B and 115C (115B and 115C are not shown in FIG. 2-B) fixed at their ends to the base plate 101, 116A, 116B and 116C (116B and 116C are not shown in FIG. 2-B) are stopper pins for the gears 112A, 112B and 112C planted on the base plate 101, 117A, 117B and 117C are attractive rubber plates provided with about 120 degree spacings on the circular ring plate 116 fixed on the base plate 101, and 119A, 119B and 119C are openings communicating to each of the attractive plates. Three spring-tension plates 120A, 120B and 120C with their one free end being fixed to the circumferential portion of the wafer chuck stand 121 as shown in FIG. 2-C are provided on the ring plate 118 on the base plates with their other free end being fixed to the ring plate with about 120 degree spacings. The tension plate is given tension when its one end is fixed to the ring plate 118. 112 is a shield rubber surrounding the circumferential portion of the chuck stand 121 having a free end portion, 123 and 124 are coaxial recessions formed on the upper surface of the chuck stand 121, 125 is a wafer chuck provided with coaxial groove 125A on its upper surface and an air suction hole 125B on its back surface, communicating to a part of the groove. 126, 127 and 128 are respectively an exhaust opening, a pipe and a nipple for exhausting the air through the opening 125B in the wafer chuck to generate negative pressure.

In FIG. 2-C, the chuck holder 125 for a small-diameter wafer for 2 inches is shown, and a semi-circular portion of a wafer chuck holder for 3 inches is shown by 125' in FIG. 2-A. 129 is a driving lever with its free end 129B being engaged with a sector plate 130 fixed unitarily with the shaft 104, and with its center portion being supported by the pin planted on the base of the base plate 101. This lever 129 is designed so as to rotate the cam gears 112A, 112B and 112C counter-clockwise by means of the gears which drive the driving lever counter-clockwise from the position of the dotted line in the measuring end memorizing station II.

Figure 3A:
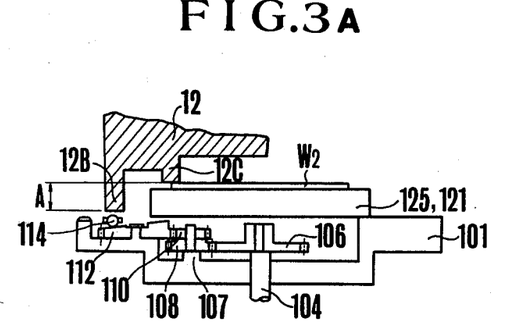

FIG. 2-B shows the start positions of the cam gears before the driving lever 129 is driven, at which positions the ball members 114A, 114B and 114C engage with the lowest valley portion of the cam left of the cam gears. As described hereinbefore, when the turn table 2 is transferred from the wafer position determining station 1 to the measuring and memorizing station II, the cylinder head $7_1$ (FIG. 1-B) raises the wafer carrier 4, so that the three attractive rubber plates 117A, 117B and 117C provided on the circumference of the wafer carrier adhere to the circumferential portion of the calibrator 4, and when these rubber plates are suctioned through the openings 119A, 119B and 119C by a suction mechanism not shown, the wafer carrier as a whole is lifted by the calibrator. As the carrier is raised, the wafer $W_2$ ($W_1$, $W_3$) collides with the wafer sensing member 12c (12a, 12b) of the calibrator. In this case, the sensing members form the first sub-standard plane. This state is schematically shown in FIG. 3-A. Therefore, when the back surface and the front surface of the wafer is not parallel, the carrier in a slightly tilted state holds the calibrator as the standard position. Thus, the attractive rubber plates function as an equalizer mechanism. After the rubber plates have been suctioned in the measuring and memorizing station II, the driving lever 129 is driven counter-clockwise at a constant angle of about 60° by a driving mechanism not shown. As the result, the gears 108 (108A, 108B, 108C), 110 (110A, 110B, 110C), 112 (112A, 112B, 112C) are driven through the gear 106, and the ball members 114A, 114B and 114C pressed against the cam surfaces by the spring plates 115A, 115B and 115C move gradually upwards. When the ball member 114 contacts the end surface of the alignment pins 12A, 12B and 12C of the calibrator, the cam gears are prevented from rotating by wedge action of the ball member. Meanwhile, the driving lever 129 is rotated constantly by the driving mechanism so that after the cam gears have stopped the driving force of the driving lever 129 is absorbed by the slip mechanism formed between the gears 106 and 110 and only the gear 108 (108A, 108B, 108C) are rotated. Thus, the cam gear 112 (112A, 112B, 112C) is stopped at the position at which the ball members 114A, 114B and 114C collide with the alignment pin of the caibrator, and position the level of the ball members 114A, 114B and 114C is set in corresponding to the left of the cam of the cam gear at the stopping position. Thus, the level of the ball members 114A, 114B and 114C is determined by the second sub-standard plane formed by the pins 12A, 12B and 12C. Then when the suction of the opening 119A (119B, 119C) is stopped and the atmospheric pressure is given through the opening, the wafer carrier 4 is again placed on the cylinder head $7_1$, and the carrier 4 engages in the hole $2_1$ on the turn table 2, when the compressed air to the cylinder is removed and is transferred to the exposure station. During this transfer, the driving lever 129 is released from engagement with the driving mechanism not shown, so that the cam bear 112 does not move. This is due to the fact that the gears 108 and 110 are pressed by the coil spring 111 to form a slip mechanism and at the same time the movement of the gear cam is prevented by the spring force. Thus, in the exposure station, each of the ball members maintains a predetermined level.

Figure 3B:
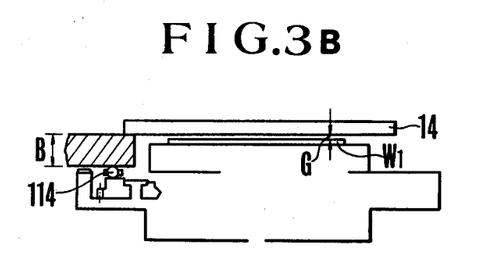
Figure 4:
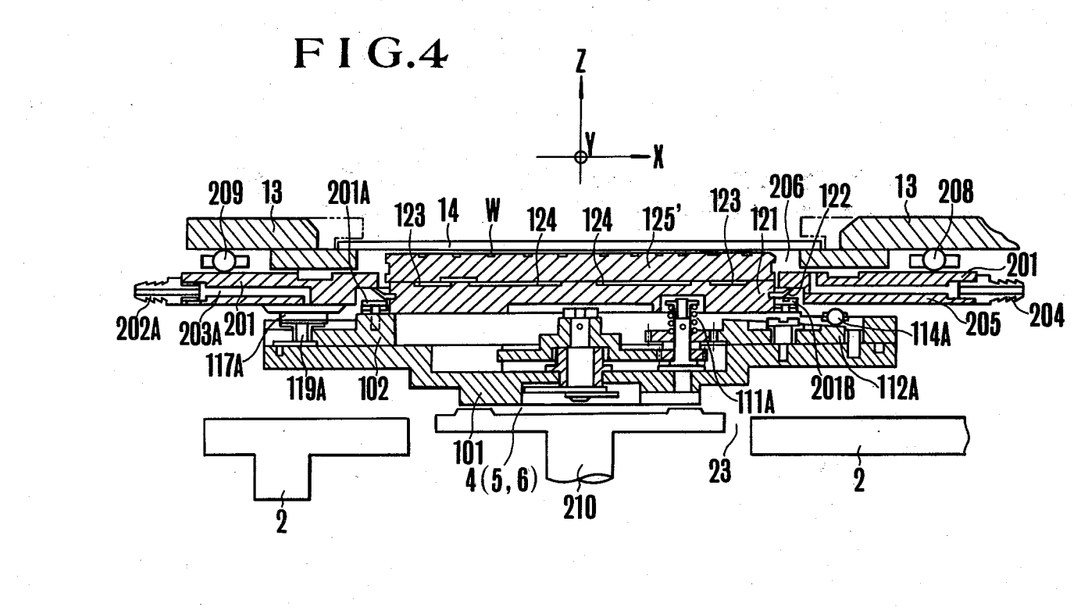
FIG. 4 shows the arrangement of the exposure station in the carrier shown in FIG. 2.
Figure 5:
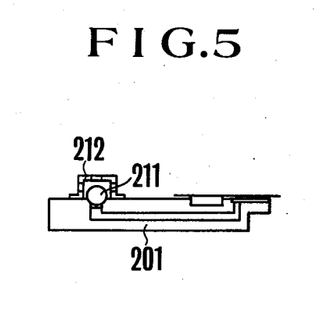
FIG. 5 shows the main portion of the exposure station shown in FIG. 4.

FIG. 3-B shows schematically the gap formation between the carrier 4 and the mask 13 transferred to the exposure station III. Supposing the distance between a desired wafer upper surface and the pattern surface (mask surface) of a mask is G, and the distance between the lower surface (first sub-standard plane) of the wafer sensing member 12C of the calibrator and the end surface (second sub-standard) of the alignment pin 12B which the ball member collides is A, and the distance between the mask pattern surface and the ball member 114 is B, the following relation is established; $G + A = B$ Therefore, in the measuring and memorizing station, the value A, the distance between the sensor member of the calibrator 12 and the alignment pin is automatically memorized in the wafer carrier, and then in the exposure station III, the operation of $B - A$ is effected in the direction along the height of the wafer carried by making the ball member 114 (114A, 114B, 114C) collide with the third sub-standard plane (it is desirable this plane has same relation to both of the second sub-standard plane and the third sub-standard plane), and the desirable distance G between the wafer surface and the pattern forming lower surface of the pattern mask is obtained by the upward movement of the carrier. Thus, in the station II between the mask setting station I and the exposure station III, when the wafer carrier reaches the exposure station with the rotation of the turn table 2, the gap between the mask pattern surface and the wafer surface is automatically set to a desired value by the upward movement of the wafer carrier. As the result, in the exposure station III, the setting step and the preliminary setting step are performed within the time required for the exposure or for the mask alignment prior to the exposure, so that all the steps can be performed simultaneously and it is possible to perform continuously exposure treatment of the wafer set in the set station by rotating the turn table.

the mechanism of the exposure station is shown in FIG. 4. In the figure, the state immediately before the distance between the lower pattern surface of the mask 14 and the wafer surface reaches a desired value, when the attractive rubber plate 117A(117B, 117C) is suctioned and the wafer carrier is attracted to the lower surface of the base frame 201 having the circular hole portion. 202 A is a nipple connected a suction device not shown. 203A is an air conductive hole provided in the frame 201 and communicating at its one end to the attraction surface of the attractive rubber plate 117A. Similar nipple 202A and hole 203A are provided on the rubber plates 117B and 117C. 204 is a nipple for performing a proximity printing of the mask pattern surface and the wafer by sealing the gas (for example, inert $N_2$ gas etc.) required for the printing within the space 206 air-tightly surrounded by the shield rubber 122 and formed by the conductive hole 205 provided in the frame 201 communicating to the mask 14 and the wafer chuck portion. This nipple is connected selectively to an outside vacuum pump so as to give vacuum state instead of the inert gas. In such a case, the wafer chuck stand 121 raises the wafer carrier 121 and the wafer chuck 125' supported on the base plate 101 against the tension of the spring plate 120A, 120B and 120C by means of the negative pressure in the closed space 206 and the atmospheric pressure and brings the pattern surface of the mask into contact with the chuck stand carrying the wafer to move the contact printing position. In this case, as the wafer chuck stand 121 is prevented from moving laterally by the spring plates held by the ring plate 102 on the base plate 101 and thus rises vertically, it is possible to contact the wafer closely with the mask in a predetermined positional relation set by relative alignment of the pattern and the wafer. 208 and 209 are respectively a ball bearing for alignment provided rollably between the mask holding stand 13 and the standard frame 201. 210 is a cylinder head. The frame 201 is provided with a valve device having a ball 211 inserted in its end face conical hole as shown in FIG. 5, which valve device functions a gas removing valve communicating to the closed space 206. When an inert gas is used, the ball 211 is pushed up to remove the gas. On the other hand, when the closed space is to be made vacuum, the ball 211 is pulled to engage with the conical hole and prevent the air from comming in through the hole. 212 is a stopper for preventing the ball from running away.

The operation of the exposure station will be described hereinunder.

A. Proximity Printing

In the station II, the level of the ball members 114A, 114B and 114C is set in correspondence to the thickness of the wafer W, and the wafer carrier 4 (5, 6) is transferred to the position of the exposure station III by the rotation of the turn table 2. As shown in FIG. 4, in the exposure station, the mask 14 holding a pattern to be printed is set on the holding stand 13, and the turn table 2 is stopped by a stopping mechanism not shown at a position where the mask pattern surface and the wafer $W_1$ ($W_2$, $W_3$) almost coincide. Then the cylinder head 210 arranged at the lower portion of the wafer carrier 4 raises the base plate of the carrier. The attractive rubber plates 117A, 117B and 117C arranged equally spaced with about 120 degrees on the ring plate 102 of the base plate 101 are attracted to the lower surface of the base frame 201, and at the same time, suctioning is effected from the nipples 202A, 202B and 202C to cause strinkage of the rubber plates 117A, 117B and 117C and thus the carrier 4 is further raised. The carrier is stopped at a position where the ball members 114A, 114B and 114C collide with the third sub-standard plane of the base frame 201. In this way, the wafer carrier 4 adheres to and supports the base frame in correspondence to the thickness of the wafer $W_1$ meausred in the station II so that the pattern on the lower surface of the mask 14 and the upper surface of the wafer on the carrier are held parallel to each other with a desired space G. The operator adjusts through the finder device 22 the holding stand 13 in the horizontal direction so as to make the standard mask (not shown) for alignment provided on the printing pattern (mask plate 14) coincide with the standard alignment mark (not shown) on the wafer $W_1$ ($W_2$, $W_3$). In this case, the nipple 128 (FIG. 2-C) is suctioned so as to attract the wafer $W_1$ ($W_2$, $W_3$) from the station II to the wafer chuck 125 (125') so that the wafer is held on the chuck surface of the carrier still in the station III. Therefore, the adjustment of the position of the mask and the wafer is done, while they are parallel and equally spaced so that the adjustment can be done uniformly and with high accuracy. The distance G is usually a very small value as several ten micron. After the completion of alignment, the finder device is removed, then the printing light source 18 is transferred above the sensitive surface of the wafer to expose the pattern on the sensitive surface, while the $N_2$ gas is spouted from the nipple 204 and the air in the space 206 is exhausted outside to prevent the oxygen effect on the sensitive surface of the wafer during to printing. The exposure is completed by closing the shutter S and then the turn table driving mechanism (not shown) rotates the turn table 2, and the next wafer $W_2$ set in the station II is transferred to the station III. At this time, the nipples 202A, 202B and 202C are released and the cylinder head 210 is moved down so that the carrier 4 engages with the opening of the turn table 2 and supported thereby. A fixing member (not shown) which engages with the driving lever 129 while the carrier 4 is transferred from the exposure station to the station I, is provided on the fixed frame in the casing 1 and drives the lever 129 clockwise about 45 degrees. The fixing member on the fixed frame is engaged with the lever 129 while the carrier 4 is rotated by the turn table 2, and the carrier drives the lever by its continuous rotation. By the drive of the driving lever 129, the gears 106, 107A, 107B and 107C are driven by a constant amount and the ball member is released from engagement with the frame, so that the cam gears 112A, 112B and 112C are also driven. As the result, ball members 114A, 114B and 114C move down and stop at the position where the cam gear is stopped by the stopper pins 116A, 116B and 16C in the valley portion of the gear and are restored to their initial position. The gear 106 drives the cam gear more than the allowed rotation limit of the cam gear but the excessive rotation is absorbed by the slip mechanism (109A, 109B, 109C) so that the cam gear is restored to its initial position without fail. When the carrier is transferred to the station I the suction of the nipple 128 is automatically released and the wafer $W_1$ is removed from the chuck 125 (125'), and a new wafer is set in the chuck as above and similar steps are continuously repeated.

B. Contact Printing

Figure 6:
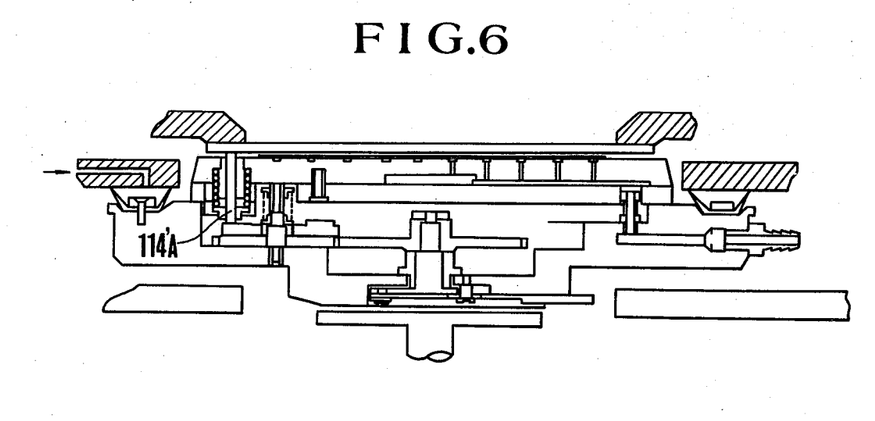
FIG. 6 is a modification of the exposure station shown in FIG. 2.
Figure 7A:
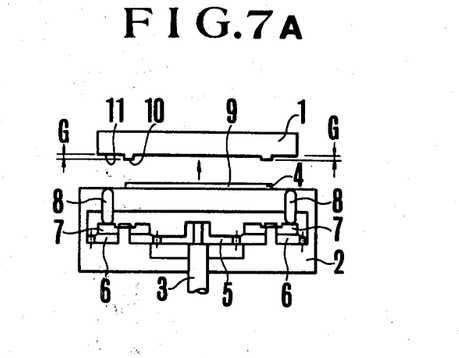
Figure 7B:
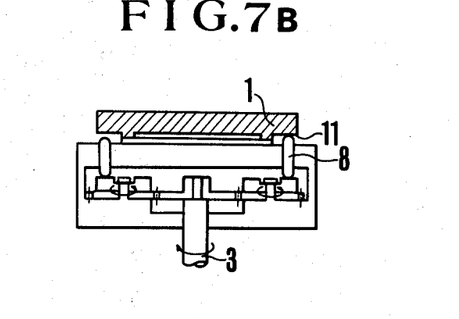
Figure 7C:
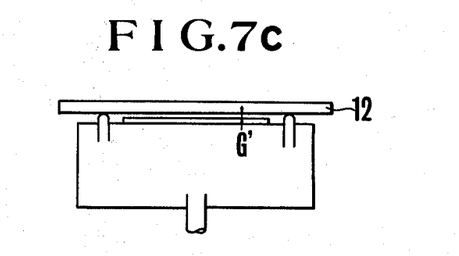

The alignment step in the stations I, II and III in case of the contact printing is just same as in case of the proximity printing as described hereinbefore. Prior to the shutter opening, vacuum suction is effected from the nipple 204, and the ball 211 functions as a valve and closes the space 206, and the pressure in the space 206 is gradually reduced. The wafer chuck stand 121 is suspended on the ring plate 102 by means of three spring plates 120A, 120B and 120C spaced by about 120 degrees, and when the vacuum degree in the space 206 increases, the wafer chuck stand rises upwards vertically without deviation due to the effect of the atmospheric pressure on the back surface of the chuck stand 121 until the back surface of the mask 14 contacts the wafer surface. The chuck stand 121 maintains the predetermined space G to the mask 14 and is held parallel to it so that the chuck stand rises maintaining the parallel state due to the action of the atmospheric pressure and thus the pattern surface of the mask contacts closely with the wafer surface. Thus, they contact each other without damaging the relatively positional relation between the mask pattern and the wafer set by in the alignment set. Then exposure by the light source 18 is done and the vacuum suction from the nipple 204 is stopped and the gas is sealed again to separate the mask from the chuck stand, and further when the gas is removed from the nipple 202A, the wafer carrier is engaged with the hole in the turn table and is transferred to the station I in the same way as in case of the proximity printing.

the ball members 114A, 114B and 114C used in the above embodiments may be substituted by a moving pin 114'A (114'B, 114'C) movable in the vertical direction as shown in FIG. 6, and the principle of the operation using such pins is shown in FIG. 7-A and FIG. 7-B, and the operation in the exposure station is shown in FIG. 7-C, but the details are just same as in the above embodiments and description therefor is omitted.

Also the spring plates 120A, 120B and 120C may be substituted by a fine steel wire for suspending the wafer chuck stand to the ring plate.

In the embodiments of the present invention as described above, the wafer is made to collide with the first sub-standard plane having a predetermined relation to the standard plane, the spacial position of the wafer carrier (the wafer thickness and position and inclination due to parallelism between the front surface and the back surface) is fixed and further the second sub-standard plane having a predetermined relation with the first sub-standard plane and being not present on the wafer surface is made to collide with the balls 114A, 114B and 114C to fix the level of the balls and thereby the distance between the sub-standard plane (first and second sub-standard planes) and the wafer surface is measured and memorized in the measuring and memorizing station, then the balls 114A, 114B and 114C are made to collide with the third sub-standard plane having relation with the second sub-standard plane so as to bring the positional relation of the carrier to the standard plane into a predetermined value so that it is possible to reduce the number of steps in the exposure station, and further still improved efficiency of the printing operation can be obtained by effecting the steps of the stations I, II and III in parallel.

What is claimed is:

1. An apparatus for precisely opposing a semi-conductor wafer with a mask and having a parallel and perdetermined space therebetween without contact of said wafer and mask, comprising:
   a mask carrier, for holding a mask having a surface, said mask carrier to be opposed with a mask;
   a wafer carrier, for holding a semiconductor wafer having a front surface, said front surface to be opposed with said surface of the mask;
   a first calibrator having a first reference plane which has a predetermined relationship with said mask surface and being in contact with the front surface of the wafer;
   first movable means for mounting said wafer carrier and for movement between a retracted position at which the wafer carrier may be loaded onto and unloaded from the first movable means and an extended position at which the front surface of the wafer may be in contact with the first reference plane;
   second movable means for mounting said wafer carrier and for movement between a retracted position and an extended position;
   turn table for transferring said wafer carrier from said first movable means to said second movable means when in said retracted positions respectively;
   equalizer means for tilting the wafer held by said carrier and for obtaining a parallel condition of the front surface of the wafer with respect to the first reference plane of the first calibrator when said wafer contacted with the first calibrator and the back surface and front surface of the wafer is not parallel;

spacing means mounted on said wafer carrier for providing an amount of tilt of the wafer with respect to the reference plane of the first calibrator; and a second calibrator having a second reference plane which has a predetermined relationship with said surface of the mask and being contacted with the spacing means when said second movable means is positioned at the extended position.

2. An apparatus according to claim 1, wherein said second calibrator is mounted on the mask carrier so as to surround the mask.

* * * * *